(12) United States Patent
Lee

(10) Patent No.: US 9,275,687 B2
(45) Date of Patent: Mar. 1, 2016

(54) SEMICONDUCTOR CHIPS

(71) Applicant: SK hynix Inc., Icheon-si Gyeonggi-do (KR)

(72) Inventor: Yin Jae Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 318 days.

(21) Appl. No.: 13/965,887

(22) Filed: Aug. 13, 2013

(65) Prior Publication Data

US 2014/0218995 A1 Aug. 7, 2014

(30) Foreign Application Priority Data

Feb. 7, 2013 (KR) .................... 10-2013-0014155

(51) Int. Cl.
*G11C 5/02* (2006.01)
*G11C 8/12* (2006.01)

(52) U.S. Cl.
CPC . *G11C 5/025* (2013.01); *G11C 8/12* (2013.01)

(58) Field of Classification Search
CPC .................................. G11C 5/025; G11C 8/12
USPC ....................... 365/51, 189.05, 205
See application file for complete search history.

(56) References Cited

U.S. PATENT DOCUMENTS 8,953,389 B2 * 2/2015 Kim et al. ................ 365/189.05
2007/0267748 A1 11/2007 Tran et al.

FOREIGN PATENT DOCUMENTS

KR 1020100084300 A 7/2010

* cited by examiner

*Primary Examiner* — Richard Elms
*Assistant Examiner* — Mohammed A Bashar
(74) *Attorney, Agent, or Firm* — William Park & Associates Ltd.

(57) ABSTRACT

A semiconductor chip includes a core region having a plurality of first memory cells and a first edge adjacent to a first side of the core region. The first edge includes a first region and a second region. The first region includes a plurality of second memory cells, and the second region includes a first pad portion through which at least one of an address signal, a command signal, a clock signal, a data signal and a control signal is inputted or outputted.

23 Claims, 5 Drawing Sheets

SEMICONDUCTOR CHIPS

CROSS-REFERENCE TO RELATED APPLICATION

The present application claims priority under 35 U.S.C. 119(a) to Korean Application No. 10-2013-0014155, filed on Feb. 7, 2013, in the Korean intellectual property Office, which is incorporated herein by reference in its entirety as set forth in full.

BACKGROUND

1. Technical Field

Embodiments of the present disclosure generally relate to semiconductor chips.

2. Related Art

In the electronics industry, high performance semiconductor devices are increasingly in demand with the development of smaller electronic systems. In response to such a demand, various technologies have been developed to provide large capacity of semiconductor modules. The large capacity of semiconductor modules may be achieved by increasing the number of memory cells which are integrated in a limited area. Recently, techniques for stacking two or more semiconductor chips are widely used to provide the large capacity of semiconductor modules which are suitable for increasing the memory capacity.

In the event that semiconductor chips having pads on their edges are stacked, spacers may be required to provide a uniform space between the semiconductor chips. The spaces between the semiconductor chips may be necessary to connect the pads to bonding wires. However, the spacers disposed between the semiconductor chips may increase a total height of each semiconductor module. Thus, there may be some limitations in realizing the large capacity of semiconductor modules.

When each of the semiconductor chips has a rectangular shape including a width and a length greater than the width, pads may be disposed on both edges of each semiconductor chip in the length direction and the rectangular semiconductor chips may be stacked to cross each other to expose the pads. In such a case, spaces may be provided on the pads even without disposing the spacers between semiconductor chips. Thus, bonding wires may be connected to the pads even without the use of the spacers. However, if the rectangular semiconductor chips are stacked to cross each other, both edges of each semiconductor chip may act as overhangs which are not physically supported by the underlying semiconductor chip. Accordingly, the bonding wires bonded to the pads may be more readily lifted to cause bonding failures. If the length of the semiconductor chips increases, the length of the overhangs may also become increased to cause more bonding failures.

SUMMARY

Various embodiments are directed to semiconductor chips.

According to various embodiments, a semiconductor chip includes a core region having a plurality of first memory cells and a first edge adjacent to a first side of the core region. The first edge includes a first region and a second region. The first region includes a plurality of second memory cells, and the second region includes a first pad portion through which at least one of an address signal, a command signal, a clock signal, a data signal and a control signal is inputted or outputted.

According to further embodiments, a semiconductor chip includes first to third columns sequentially arrayed in a first direction and first to third rows sequentially arrayed in a first direction. Moreover, the semiconductor chip includes a plurality of first memory cells and a plurality of second memory cells. The plurality of first memory cells are disposed in a first region located at an intersection of the first column and the first row, and the plurality of second memory cells are disposed in a second region in the second row.

According to further embodiments, a semiconductor chip includes first to third columns sequentially arrayed in a first direction and first to third rows sequentially arrayed in a first direction. The semiconductor chip includes a plurality of first memory cells disposed in a first region located at an intersection of the first column and the first row, a plurality of second memory cells disposed in a second region in the second row, a first pad portion disposed in a third region located at an intersection of the second column and the first row, and a plurality of third memory cells disposed in a fourth region located at an intersection of the third column and the first row. The first pad portion receives or outputs at least one of an address signal, a command signal, a clock signal, a data signal and a control signal.

According to an embodiment, a semiconductor chip includes a core region including a first memory cell; and a first edge adjacent to a first side of the core region, wherein the first edge includes a first region and a second region, and wherein the first region includes second memory cell and the second region includes a first pad portion through which a signal is inputted or outputted.

According to an embodiment, a semiconductor chip includes first and second columns sequentially arrayed in a first direction; first and second rows sequentially arrayed in a second direction; a first memory cell disposed in a first region located at an intersection of the first column and the first row; and a second memory cell disposed in a second region in the second row.

According to an embodiment, a semiconductor chip includes a core region including a plurality of first memory cells; a first edge adjacent to a first side of the core region; and a second edge adjacent to a second side of the core region, wherein the first edge includes a first region and a second region, wherein the first region includes a plurality of second memory cells and the second region includes a first pad portion through which a signal is inputted or outputted, wherein the second edge includes a third region and a fourth region, and wherein the third region includes a plurality of third memory cells and the fourth region includes a second pad portion through which the signal is inputted or outputted.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Various examples of embodiments and their inventive concepts will be described hereinafter with reference to the accompanying drawings. However, the various embodiments described herein are for illustrative purposes only and are not intended to limit the scope of the inventive concepts.

Figure 1:
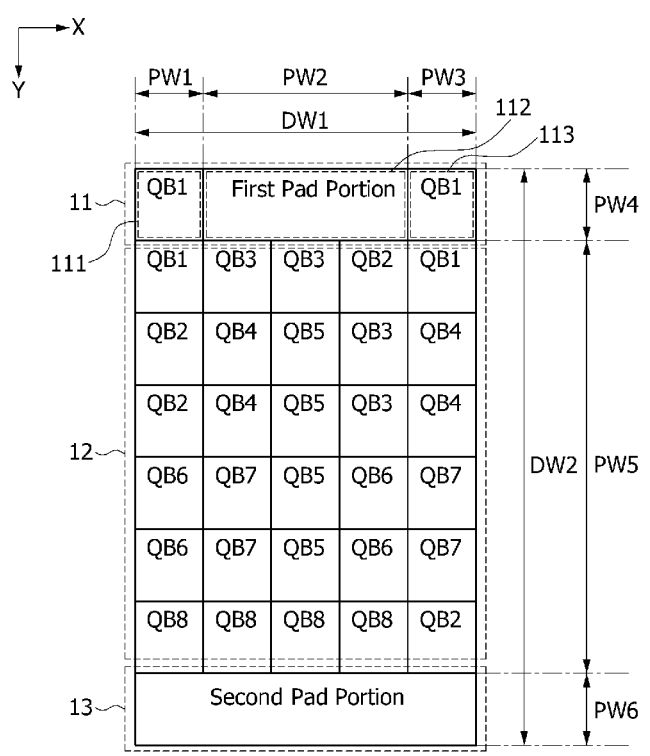
FIG. 1 is a plan view illustrating a configuration of a semiconductor chip according to an embodiment.

FIG. 1 is a plan view illustrating a configuration of a semiconductor chip according to an embodiment.

As illustrated in FIG. 1, a semiconductor chip according to an embodiment may have a first side width DW1 in a first direction X and a second side width DW2 in a second direction Y. Further, the semiconductor chip may include first to third columns which are sequentially arrayed in the first direction X and first to third rows which are sequentially arrayed in the second direction Y. The first to third columns may have a first width PW1, a second width PW2 and a third width PW3 in the first direction X, respectively. The first to third rows may have a fourth width PW4, a fifth width PW5 and a sixth width PW6 in the second direction Y, respectively. Thus, the first side width DW1 may be substantially equal to a sum of the first width PW1, the second width PW2 and the third width PW3, and the second side width DW2 may be substantially equal to a sum of the fourth width PW4, the fifth width PW5 and the sixth width PW6.

The semiconductor chip may include a first edge 11 disposed in the first row, a core region 12 disposed in the second row, and a second edge 13 disposed in the third row. Thus, the first edge 11, the core region 12 and the second edge 13 may have the fourth width PW4, the fifth width PW5 and the sixth width PW6 in the second direction Y, respectively. The first edge 11 may be disposed to be adjacent to one side of the core region 12 opposite to the second edge 13. That is, the core region 12 may be disposed between the first and second edges 11 and 13.

The first edge 11 may include a first region 111, a second region 112 and a third region 113 which are sequentially arrayed in the first direction X. The first region 111 may be located at an intersection of the first column and the first row, the second region 112 may be located at an intersection of the second column and the first row, and the third region 113 may be located at an intersection of the third column and the first row. Accordingly, the first region 111 may have the first width PW1 in the first direction X and the fourth width PW4 in the second direction Y, the second region 112 may have the second width PW2 in the first direction X and the fourth width PW4 in the second direction Y, and the third region 113 may have the third width PW3 in the first direction X and the fourth width PW4 in the second direction Y.

The core region 12 may have the first side width DW1 in the first direction X and the fifth width PW5 in the second direction Y. The second edge 13 may have the first side width DW1 in the first direction X and the sixth width PW6 in the second direction Y.

First to eighth banks are disposed in the first region 111, the third region 113 and the core region 12. Each of the first to eighth banks may include four quarter banks. That is, the first bank may include four first quarter banks QB1, the second bank may include four second quarter banks QB2, the third bank may include four third quarter banks QB3, and the fourth bank may include four fourth quarter banks QB4. Similarly, the fifth bank may include four fifth quarter banks QB5, the sixth bank may include four sixth quarter banks QB6, the seventh bank may include four seventh quarter banks QB7, and the fourth bank may include four eighth quarter banks QB8. Each quarter bank may include a plurality of memory cells. The memory cells in each bank (e.g., four quarter banks) may be simultaneously accessed by the same bank address. In the present embodiments, two of the first quarter banks QB1 may be disposed in the first region 111 and the third region 113, respectively. The other quarter banks (e.g., two other first quarter banks QB1 and all the quarter banks of the second to eighth banks) may be disposed in the core region 12. Although the present embodiments are described in conjunction with an example that each bank includes four quarter banks and the four quarter banks in each bank are simultaneously accessed by the same bank address, the inventive concept is not limited thereto. For example, in various embodiments, the number of the sub-banks constituting each bank may be two, eight or more, and the number of the quarter banks disposed in each of the first region 111, the third region 113 and the core region 12 may be different from the present embodiments illustrated in FIG. 1.

A first pad portion may be disposed in the second region 112 of the first edge 11, and a second pad portion may be disposed in the second edge 13. At least one of an address signal, a command signal, a clock signal, a data signal and a control signal may be inputted or outputted through the first pad portion or the second pad portion. For example, the first pad portion may include a plurality of pads through which the address signal and the command signal are inputted and outputted, and the second pad portion may include a plurality of pads through which the data signal, the clock signal and the control signal are inputted and outputted. In the present embodiments, the second edge 13 may be configured to include only the second pad portion without any memory cells, the inventive concept is not limited thereto. For example, in various embodiments, the second edge 13 may be configured to include memory cells like the first edge 11.

As described above, the first edge 11 may be divided into the first region 111, the second region 112 and the third region 113, and the memory cells may be disposed in the first and third regions 111 and 113. Further, the first pad portion may be disposed in the second region 112. Thus, the memory cells as well as the first pad portion may be disposed in the first edge 11 to minimize an area of a dummy region without any memory cells. That is, a compact layout may be realized to increase the integration density of the semiconductor chip. In addition, according to the embodiments, the area of the dummy region may be minimized to reduce the second side width DW2 in the second direction Y. Thus, when a plurality of semiconductor chips according to the embodiments are vertically stacked to cross each other, lengths of overhangs of the upper semiconductor chips stacked on the lowermost semiconductor chip may be reduced to lower the probability of bonding failures.

Figure 2:
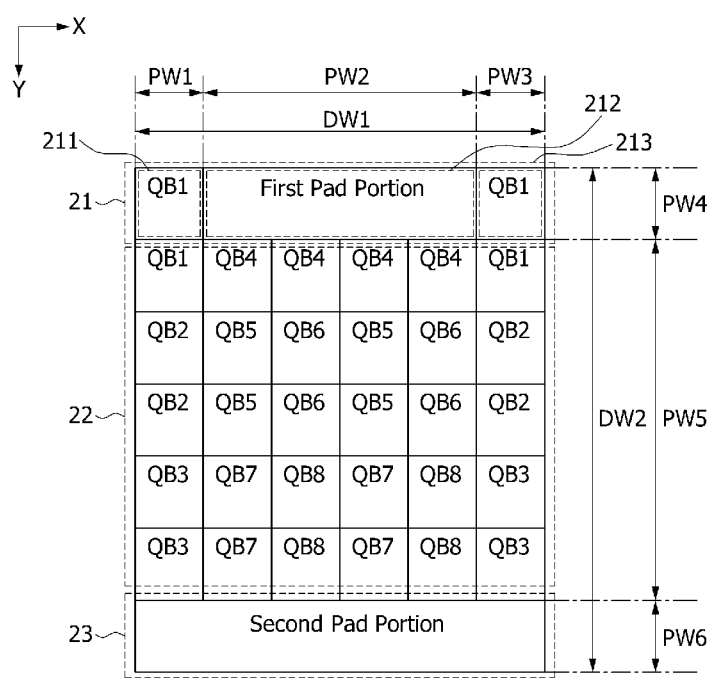
FIG. 2 is a plan view illustrating a configuration of a semiconductor chip according to an embodiment.

FIG. 2 is a plan view illustrating a configuration of a semiconductor chip according to an embodiment.

As illustrated in FIG. 2, a semiconductor chip according to an embodiment may have a first side width DW1 in a first direction X and a second side width DW2 in a second direction Y. Further, the semiconductor chip may include first to third columns which are sequentially arrayed in the first direction X and first to third rows which are sequentially arrayed in the second direction Y. The first to third columns may have a first width PW1, a second width PW2 and a third width PW3 in the first direction X, respectively. The first to third rows may have a fourth width PW4, a fifth width PW5 and a sixth width PW6 in the second direction Y, respectively. Thus, the first side width DW1 may be substantially equal to a sum of the first width PW1, the second width PW2 and the third width PW3, and the second side width DW2 may be substantially equal to a sum of the fourth width PW4, the fifth width PW5 and the sixth width PW6.

The semiconductor chip may include a first edge 21 disposed in the first row, a core region 22 disposed in the second row, and a second edge 23 disposed in the third row. Thus, the first edge 21, the core region 22 and the second edge 23 may have the fourth width PW4, the fifth width PW5 and the sixth width PW6 in the second direction Y, respectively. The first edge 21 may be disposed to be adjacent to one side of the core region 22 opposite to the second edge 23. That is, the core region 22 may be disposed between the first and second edges 21 and 23.

The first edge 21 may include a first region 211, a second region 212 and a third region 213 which are sequentially arrayed in the first direction X. The first region 211 may be located at an intersection of the first column and the first row, the second region 212 may be located at an intersection of the second column and the first row, and the third region 213 may be located at an intersection of the third column and the first row. Accordingly, the first region 211 may have the first width PW1 in the first direction X and the fourth width PW4 in the second direction Y, the second region 212 may have the second width PW2 in the first direction X and the fourth width PW4 in the second direction Y, and the third region 213 may have the third width PW3 in the first direction X and the fourth width PW4 in the second direction Y.

The core region 22 may have the first side width DW1 in the first direction X and the fifth width PW5 in the second direction Y. The second edge 23 may have the first side width DW1 in the first direction X and the sixth width PW6 in the second direction Y.

First to eighth banks are disposed in the first region 211, the third region 213 and the core region 22. Each of the first to eighth banks may include four quarter banks. That is, the first bank may include four first quarter banks QB1, the second bank may include four second quarter banks QB2, the third bank may include four third quarter banks QB3, and the fourth bank may include four fourth quarter banks QB4. Similarly, the fifth bank may include four fifth quarter banks QB5, the sixth bank may include four sixth quarter banks QB6, the seventh bank may include four seventh quarter banks QB7, and the fourth bank may include four eighth quarter banks QB8. Each quarter bank may include a plurality of memory cells. The memory cells in each bank (e.g., four quarter banks) may be simultaneously accessed by the same bank address. In the present embodiments, two of the first quarter banks QB1 may be disposed in the first region 211 and the third region 213, respectively. The other quarter banks (e.g., two other first quarter banks QB1 and all the quarter banks of the second to eighth banks) may be disposed in the core region 22. Although the present embodiments are described in conjunction with an example that each bank includes four quarter banks and the four quarter banks in each bank are simultaneously accessed by the same bank address, the inventive concept is not limited thereto. For example, in various embodiments, the number of the sub-banks constituting each bank may be two, eight or more, and the number of the quarter banks disposed in each of the first region 211, the third region 213 and the core region 22 may be different from the present embodiments illustrated in FIG. 2. According to the present embodiments, the quarter banks in the core region 22 may be arrayed in a matrix form of "6×5" while the quarter banks in the core region 12 of the previous embodiments of FIG. 1 are arrayed in a matrix form of "5×6". That is, according to the present embodiments, the number of the rows in the core region 22 is reduced as compared with the previous embodiments illustrated in FIG. 1.

A first pad portion may be disposed in the second region 212 of the first edge 21, and a second pad portion may be disposed in the second edge 23. At least one of an address signal, a command signal, a clock signal, a data signal and a control signal may be inputted or outputted through the first pad portion or the second pad portion. For example, the first pad portion may include a plurality of pads through which the address signal and the command signal are inputted and outputted, and the second pad portion may include a plurality of pads through which the data signal, the clock signal and the control signal are inputted and outputted. In the present embodiments, the second edge 23 may be configured to include only the second pad portion without any memory cells, the inventive concept is not limited thereto. For example, in various embodiments, the second edge 23 may be configured to include memory cells like the first edge 21.

As described above, the first edge 21 may be divided into the first region 211, the second region 212 and the third region 213, and the memory cells may be disposed in the first and third regions 211 and 213. Further, the first pad portion may be disposed in the second region 212. Thus, the memory cells as well as the first pad portion may be disposed in the first edge 21 to minimize an area of a dummy region without any memory cells. That is, a compact layout may be realized to increase the integration density of the semiconductor chip. In addition, according to the embodiments, the area of the dummy region may be minimized to reduce the second side width DW2 in the second direction Y. Thus, when a plurality of semiconductor chips according to the embodiments are vertically stacked to cross each other, lengths of overhangs of the upper semiconductor chips stacked on the lowermost semiconductor chip may be reduced to lower the probability of bonding failures.

Figure 3:
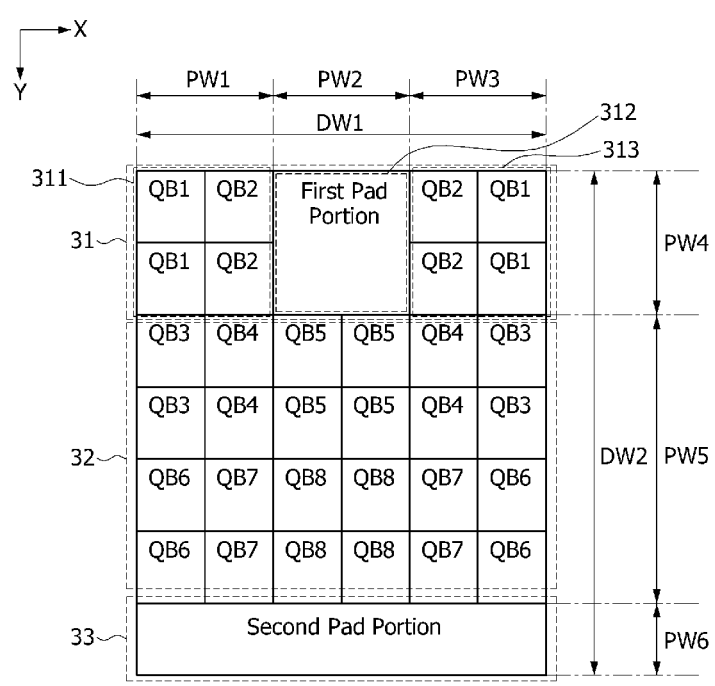
FIG. 3 is a plan view illustrating a configuration of a semiconductor chip according to an embodiment.

FIG. 3 is a plan view illustrating a configuration of a semiconductor chip according to an embodiment.

As illustrated in FIG. 3, a semiconductor chip according to an embodiment may have a first side width DW1 in a first direction X and a second side width DW2 in a second direction Y. Further, the semiconductor chip may include first to third columns which are sequentially arrayed in the first direction X and first to third rows which are sequentially arrayed in the second direction Y. The first to third columns may have a first width PW1, a second width PW2 and a third width PW3 in the first direction X, respectively. The first to third rows may have a fourth width PW4, a fifth width PW5 and a sixth width PW6 in the second direction Y, respectively. Thus, the first side width DW1 may be substantially equal to a sum of the first width PW1, the second width PW2 and the third width PW3, and the second side width DW2 may be substantially equal to a sum of the fourth width PW4, the fifth width PW5 and the sixth width PW6.

The semiconductor chip may include a first edge 31 disposed in the first row, a core region 32 disposed in the second row, and a second edge 33 disposed in the third row. Thus, the first edge 31, the core region 32 and the second edge 33 may have the fourth width PW4, the fifth width PW5 and the sixth width PW6 in the second direction Y, respectively. The first edge 31 may be disposed to be adjacent to one side of the core region 32 opposite to the second edge 33. That is, the core region 32 may be disposed between the first and second edges 31 and 33.

The first edge 31 may include a first region 311, a second region 312 and a third region 313 which are sequentially arrayed in the first direction X. The first region 311 may be located at an intersection of the first column and the first row, the second region 312 may be located at an intersection of the second column and the first row, and the third region 313 may be located at an intersection of the third column and the first row. Accordingly, the first region 311 may have the first width PW1 in the first direction X and the fourth width PW4 in the second direction Y, the second region 312 may have the second width PW2 in the first direction X and the fourth width PW4 in the second direction Y, and the third region 313 may have the third width PW3 in the first direction X and the fourth width PW4 in the second direction Y.

The core region 32 may have the first side width DW1 in the first direction X and the fifth width PW5 in the second direction Y. The second edge 33 may have the first side width DW1 in the first direction X and the sixth width PW6 in the second direction Y.

First to eighth banks are disposed in the first region 311, the third region 313 and the core region 32. Each of the first to eighth banks may include four quarter banks. That is, the first bank may include four first quarter banks QB1, the second bank may include four second quarter banks QB2, the third bank may include four third quarter banks QB3, and the fourth bank may include four fourth quarter banks QB4. Similarly, the fifth bank may include four fifth quarter banks QB5, the sixth bank may include four sixth quarter banks QB6, the seventh bank may include four seventh quarter banks QB7, and the fourth bank may include four eighth quarter banks QB8. Each quarter bank may include a plurality of memory cells. The memory cells in each bank (e.g., four quarter banks) may be simultaneously accessed by the same bank address. In the present embodiments, two of the first quarter banks QB1 may be disposed in the first region 311 and the other two of the first quarter banks QB1 may be disposed in the third region 313. Similarly, two of the second quarter banks QB2 may be disposed in the first region 311 and the other two of the second quarter banks QB2 may be disposed in the third region 313. All the quarter banks of the third to eighth banks may be disposed in the core region 32. Although the present embodiments are described in conjunction with an example that each bank includes four quarter banks and the four quarter banks in each bank are simultaneously accessed by the same bank address, the inventive concept is not limited thereto. For example, in various embodiments, the number of the sub-banks constituting each bank may be two, eight or more, and the number of the quarter banks disposed in each of the first region 311, the third region 313 and the core region 32 may be different from the present embodiments illustrated in FIG. 3. According to the present embodiments, the quarter banks in the core region 32 may be arrayed in a matrix form of "6×4". That is, according to the present embodiments, the number of the rows in the core region 32 is reduced as compared with the previous embodiments illustrated in FIGS. 1 and 2.

A first pad portion may be disposed in the second region 312 of the first edge 31, and a second pad portion may be disposed in the second edge 33. At least one of an address signal, a command signal, a clock signal, a data signal and a control signal may be inputted or outputted through the first pad portion or the second pad portion. For example, the first pad portion may include a plurality of pads through which the address signal and the command signal are inputted and outputted, and the second pad portion may include a plurality of pads through which the data signal, the clock signal and the control signal are inputted and outputted. In the present embodiments, the second edge 33 may be configured to include only the second pad portion without any memory cells, the inventive concept is not limited thereto. For example, in various embodiments, the second edge 33 may be configured to include memory cells like the first edge 31.

As described above, the first edge 31 may be divided into the first region 311, the second region 312 and the third region 313, and the memory cells may be disposed in the first and third regions 311 and 313. Further, the first pad portion may be disposed in the second region 312. Thus, the memory cells as well as the first pad portion may be disposed in the first edge 31 to minimize an area of a dummy region without any memory cells. That is, a compact layout may be realized to increase the integration density of the semiconductor chip. In addition, according to the embodiments, the area of the dummy region may be minimized to reduce the second side width DW2 in the second direction Y. Thus, when a plurality of semiconductor chips according to the embodiments are vertically stacked to cross each other, lengths of overhangs of the upper semiconductor chips stacked on the lowermost semiconductor chip may be reduced to lower the probability of bonding failures.

Figure 4:
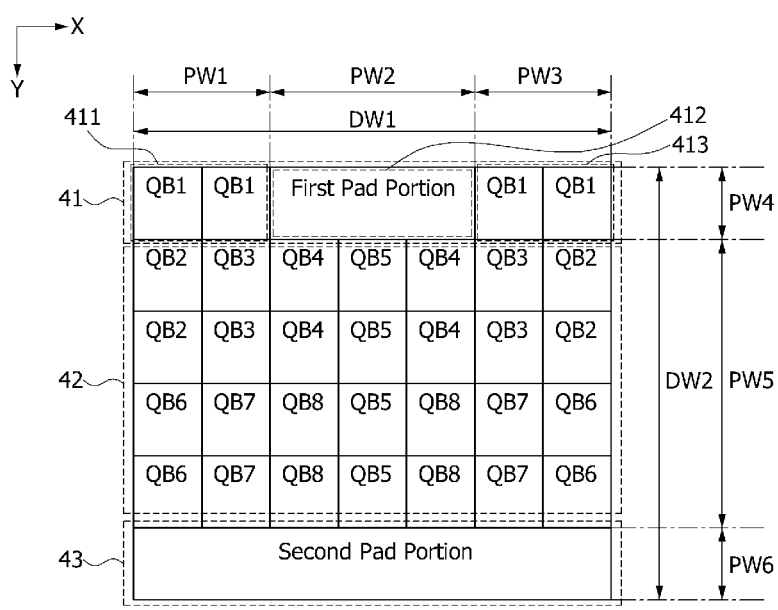
FIG. 4 is a plan view illustrating a configuration of a semiconductor chip according to an embodiment.

FIG. 4 is a plan view illustrating a configuration of a semiconductor chip according to an embodiment.

As illustrated in FIG. 4, a semiconductor chip according to an embodiment may have a first side width DW1 in a first direction X and a second side width DW2 in a second direction Y. Further, the semiconductor chip may include first to third columns which are sequentially arrayed in the first direction X and first to third rows which are sequentially arrayed in the second direction Y. The first to third columns may have a first width PW1, a second width PW2 and a third width PW3 in the first direction X, respectively. The first to third rows may have a fourth width PW4, a fifth width PW5 and a sixth width PW6 in the second direction Y, respectively. Thus, the first side width DW1 may be substantially equal to a sum of the first width PW1, the second width PW2 and the third width PW3, and the second side width DW2 may be substantially equal to a sum of the fourth width PW4, the fifth width PW5 and the sixth width PW6.

The semiconductor chip may include a first edge 41 disposed in the first row, a core region 42 disposed in the second row, and a second edge 43 disposed in the third row. Thus, the first edge 41, the core region 42 and the second edge 43 may have the fourth width PW4, the fifth width PW5 and the sixth width PW6 in the second direction Y, respectively. The first edge 41 may be disposed to be adjacent to one side of the core region 42 opposite to the second edge 43. That is, the core region 42 may be disposed between the first and second edges 41 and 43.

The first edge 41 may include a first region 411, a second region 412 and a third region 413 which are sequentially arrayed in the first direction X. The first region 411 may be located at an intersection of the first column and the first row, the second region 412 may be located at an intersection of the second column and the first row, and the third region 413 may be located at an intersection of the third column and the first row. Accordingly, the first region 411 may have the first width PW1 in the first direction X and the fourth width PW4 in the second direction Y, the second region 412 may have the second width PW2 in the first direction X and the fourth width PW4 in the second direction Y, and the third region 413 may have the third width PW3 in the first direction X and the fourth width PW4 in the second direction Y.

The core region 42 may have the first side width DW1 in the first direction X and the fifth width PW5 in the second direction Y. The second edge 43 may have the first side width DW1 in the first direction X and the sixth width PW6 in the second direction Y.

First to eighth banks are disposed in the first region 411, the third region 413 and the core region 42. Each of the first to eighth banks may include four quarter banks. That is, the first bank may include four first quarter banks QB1, the second bank may include four second quarter banks QB2, the third bank may include four third quarter banks QB3, and the fourth bank may include four fourth quarter banks QB4. Similarly, the fifth bank may include four fifth quarter banks QB5, the sixth bank may include four sixth quarter banks QB6, the seventh bank may include four seventh quarter banks QB7, and the fourth bank may include four eighth quarter banks QB8. Each quarter bank may include a plurality of memory cells. The memory cells in each bank (e.g., four quarter banks) may be simultaneously accessed by the same bank address. In the present embodiments, two of the first quarter banks QB1 may be disposed in the first region 411 and the other two of the first quarter banks QB1 may be disposed in the third region 413. All the quarter banks of the second to eighth banks may be disposed in the core region 42. Although the present embodiments are described in conjunction with an example that each bank includes four quarter banks and the four quarter banks in each bank are simultaneously accessed by the same bank address, the inventive concept is not limited thereto. For example, in various embodiments, the number of the sub-banks constituting each bank may be two, eight or more, and the number of the quarter banks disposed in each of the first region 411, the third region 413 and the core region 42 may be different from the present embodiments illustrated in FIG. 4. According to the present embodiments, the quarter banks in the core region 42 may be arrayed in a matrix form of "7×4".

A first pad portion may be disposed in the second region 412 of the first edge 41, and a second pad portion may be disposed in the second edge 43. At least one of an address signal, a command signal, a clock signal, a data signal and a control signal may be inputted or outputted through the first pad portion or the second pad portion. For example, the first pad portion may include a plurality of pads through which the address signal and the command signal are inputted and outputted, and the second pad portion may include a plurality of pads through which the data signal, the clock signal and the control signal are inputted and outputted. In the present embodiments, the second edge 43 may be configured to include only the second pad portion without any memory cells, the inventive concept is not limited thereto. For example, in various embodiments, the second edge 43 may be configured to include memory cells like the first edge 41.

As described above, the first edge 41 may be divided into the first region 411, the second region 412 and the third region 413, and the memory cells may be disposed in the first and third regions 411 and 413. Further, the first pad portion may be disposed in the second region 412. Thus, the memory cells as well as the first pad portion may be disposed in the first edge 41 to minimize an area of a dummy region without any memory cells. That is, a compact layout may be realized to increase the integration density of the semiconductor chip. In addition, according to an embodiment, the area of the dummy region may be minimized to reduce the second side width DW2 in the second direction Y. Thus, when a plurality of semiconductor chips according to the embodiment are vertically stacked to cross each other, lengths of overhangs of the upper semiconductor chips stacked on the lowermost semiconductor chip may be reduced to lower the probability of bonding failures.

As described with reference to FIGS. 1 to 4, according to the embodiments, memory cells as well as a pad portion may be disposed in at least one edge of a semiconductor chip. Thus, an area of a dummy region may be minimized to reduce a length of the semiconductor chip. As a result, highly integrated semiconductor chips may be realized with a compact layout. Further, when a plurality of semiconductor chips according to the embodiments are vertically stacked to cross each other, lengths of overhangs of the upper semiconductor chips stacked on the lowermost semiconductor chip may be reduced to lower the probability of bonding failures.

Figure 5:
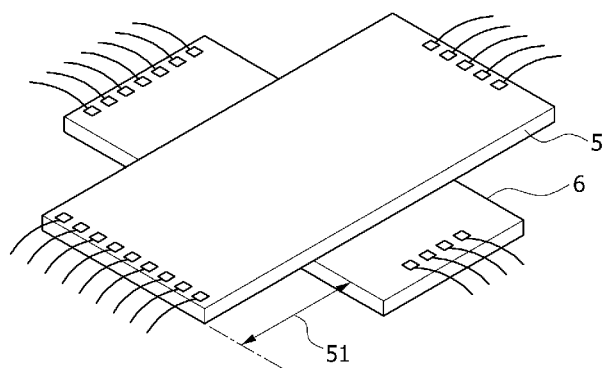
FIG. 5 is a perspective view illustrating an example of semiconductor modules including semiconductor chips according to various embodiments.

FIG. 5 is a perspective view illustrating an example of semiconductor modules including semiconductor chips according to various embodiments.

Referring to FIG. 5, a first semiconductor chip 5 may be stacked on a second semiconductor chip 6. Each of the first and second semiconductor chips 5 and 6 may have the same configuration as any one of the semiconductor chips described with reference to FIGS. 1 to 4, and the first semiconductor chip 5 may be stacked to cross over the second semiconductor chip 6. Thus, both edges of the first semiconductor chip 5 may correspond to overhangs 51. In such a case, a length of the first semiconductor chip 5 may be reduced because memory cells are disposed even in at least one of both edges of the first semiconductor chip 5, as described with reference to FIGS. 1 to 4. Accordingly, a length of the overhangs 51 may also be reduced. As a result, the probability of bonding failures may be lowered.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor chip comprising:
  a core region including a plurality of first memory cells; and
  a first edge adjacent to a first side of the core region,
  wherein the first edge includes a first region and a second region,
  wherein the first region includes a plurality of second memory cells and the second region includes a first pad portion through which at least one of an address signal, a command signal, a clock signal, a data signal and a control signal is inputted or outputted,
  wherein the first edge and the core region are sequentially arrayed in a first direction, and
  wherein the first region and the second region are sequentially arrayed in a second direction.

2. The semiconductor chip of claim 1, wherein all the second memory cells and some of the first memory cells are simultaneously accessed by a same bank address.

3. The semiconductor chip of claim 2, further comprising a second edge adjacent to a second side of the core region,
  wherein the second edge includes a second pad portion.

4. The semiconductor chip of claim 3, wherein the first side and the second side of the core region are opposite to each other.

5. The semiconductor chip of claim 2, further comprising a second edge adjacent to a second side of the core region,
  wherein the second edge includes a third region in which third memory cells are disposed and a second pad portion through which at least one of the address signal, the command signal, the clock signal, the data signal and the control signal is inputted or outputted.

6. The semiconductor chip of claim 5, wherein the first side and the second side of the core region are opposite to each other.

7. The semiconductor chip of claim 6, wherein all the second memory cells and some of the first memory cells are simultaneously accessed by the same bank address.

8. A semiconductor chip including first to third columns sequentially arrayed in a first direction and first to third rows sequentially arrayed in a second direction, the semiconductor chip comprising:
- a plurality of first memory cells disposed in a first region located at an intersection of the first column and the first row; and
- a plurality of second memory cells disposed in a second region in the second row.

9. The semiconductor chip of claim 8, wherein all the first memory cells and a portion of the second memory cells are simultaneously accessed by a same bank address.

10. The semiconductor chip of claim 8, further comprising a first pad portion disposed in a third region located at an intersection of the second column and the first row,
- wherein the first pad portion receives or outputs at least one of an address signal, a command signal, a clock signal, a data signal and a control signal.

11. The semiconductor chip of claim 8, further comprising a plurality of third memory cells disposed in a fourth region located at an intersection of the third column and the first row.

12. The semiconductor chip of claim 11, wherein all the first memory cells, all the second memory cells and a portion of the third memory cells are simultaneously accessed by a same bank address.

13. The semiconductor chip of claim 11, wherein the first memory cells and the third memory cells are simultaneously accessed by the same bank address.

14. The semiconductor chip of claim 8, further comprising a second pad portion disposed in the third row,
- wherein the second pad portion receives or outputs at least one of an address signal, a command signal, a clock signal, a data signal and a control signal.

15. A semiconductor chip including first to third columns sequentially arrayed in a first direction and first to third rows sequentially arrayed in a second direction, the semiconductor chip comprising:
- a plurality of first memory cells disposed in a first region located at an intersection of the first column and the first row;
- a plurality of second memory cells disposed in a second region in the second row;
- a first pad portion disposed in a third region located at an intersection of the second column and the first row; and
- a plurality of third memory cells disposed in a fourth region located at an intersection of the third column and the first row,
- wherein the first pad portion receives or outputs at least one of an address signal, a command signal, a clock signal, a data signal and a control signal.

16. The semiconductor chip of claim 15, wherein all the first memory cells, all the third memory cells and a portion of the second memory cells are simultaneously accessed by a same bank address.

17. The semiconductor chip of claim 16, wherein the first memory cells and the third memory cells are simultaneously accessed by the same bank address.

18. The semiconductor chip of claim 17, further comprising a second pad portion disposed in the third row, wherein the second pad portion receives or outputs at least one of the address signal, the command signal, the clock signal, the data signal and the control signal.

19. A semiconductor chip comprising:
- a core region including a first memory cell; and
- a first edge adjacent to a first side of the core region,
- wherein the first edge includes a first region and a second region,
- wherein the first region includes second memory cell and the second region includes a first pad portion through which a signal is inputted or outputted,
- wherein the first edge and the core region are sequentially arrayed in a first direction, and
- wherein the first region and the second region are sequentially arrayed in a second direction.

20. A semiconductor chip comprising:
- first and second columns sequentially arrayed in a first direction;
- first and second rows sequentially arrayed in a second direction:
- a first memory cell disposed in a first region located at an intersection of the first column and the first row; and
- a second memory cell disposed in a second region in the second row.

21. The semiconductor chip of claim 20, further comprising:
- a third column sequentially arrayed with the second column in the first direction; and
- a third row sequentially arrayed with the second row in the second direction.

22. The semiconductor chip of claim 20:
- wherein the multiple first memory cells are disposed in the first region located at the intersection of the first column and the first row; and
- wherein the first memory cell and the second memory cell is substantially simultaneously accessed by a same bank address.

23. A semiconductor chip comprising:
- a core region including a plurality of first memory cells;
- a first edge adjacent to a first side of the core region; and
- a second edge adjacent to a second side of the core region,
- wherein the first edge includes a first region and a second region,
- wherein the first region includes a plurality of second memory cells and the second region includes a first pad portion through which a signal is inputted or outputted,
- wherein the second edge includes a third region and a fourth region,
- wherein the third region includes a plurality of third memory cells and the fourth region includes a second pad portion through which the signal is inputted or outputted,
- wherein the first edge and the core region are sequentially arrayed in a first direction, and
- wherein the first region and the second region are sequentially arrayed in a second direction.

* * * * *